United States Patent [19]

Sakai et al.

[11] Patent Number: 4,563,227

[45] Date of Patent: Jan. 7, 1986

[54] METHOD FOR MANUFACTURING A SEMICONDUCTOR DEVICE

[75] Inventors: Hiroyuki Sakai; Kenji Kawakita; Tsutomu Fujita, all of Osaka; Toyoki Takemoto, Kyoto, all of Japan

[73] Assignee: Matsushita Electric Industrial Co., Ltd., Osaka, Japan

[21] Appl. No.: 660,255

[22] Filed: Oct. 12, 1984

Related U.S. Application Data

[63] Continuation of Ser. No. 428,991, Sep. 30, 1983, abandoned.

[30] Foreign Application Priority Data

| Dec. 8, 1981 [JP] | Japan | 56-198934 |
| Dec. 22, 1981 [JP] | Japan | 56-20856 |
| Feb. 19, 1982 [JP] | Japan | 57-26245 |
| Feb. 19, 1982 [JP] | Japan | 57-26247 |

[51] Int. Cl.$^4$ .................. H01L 21/38; H01L 21/467
[52] U.S. Cl. .................................. 148/187; 29/571; 29/576 W; 29/578; 29/580
[58] Field of Search ............... 29/571, 576 W, 578, 29/580; 148/187

[56] References Cited

U.S. PATENT DOCUMENTS

| 3,755,001 | 8/1973 | Kooi et al. | 148/187 X |
| 3,958,040 | 5/1976 | Webb | 148/187 X |
| 4,002,511 | 1/1977 | Magdoo et al. | 148/187 |
| 4,187,125 | 2/1980 | Feist | 148/1.5 |
| 4,271,583 | 6/1981 | Kahng et al. | 29/571 |
| 4,272,308 | 6/1981 | Varshney | 148/187 |
| 4,313,255 | 2/1982 | Shinozaki et al. | 29/576 B |
| 4,373,965 | 2/1983 | Smigelski | 148/187 X |
| 4,394,196 | 7/1983 | Iwai | 148/187 |

FOREIGN PATENT DOCUMENTS 12749  2/1981  Japan ............... 29/576 W

Primary Examiner—George T. Ozaki
Attorney, Agent, or Firm—Burgess, Ryan & Wayne

[57] ABSTRACT

The invention provides a method for manufacturing a semiconductor device, wherein a semiconductor substrate is vertically etched to form a groove, antioxidant insulating films are formed on the side walls of the groove, and local oxidation is performed. Lateral extrusion of an oxide film which is a so-called bird's beak and a projection of the oxide film which is a so-called bird's head are substantially eliminated. As a result, the active region of the transistor, that is, the element formation region may not be narrowed, providing high packing density and high precision. Furthermore, the surface of the semiconductor substrate is flattened to prevent short-circuiting and disconnections of wiring layers. Stable manufacturing process provides a high yield of the semiconductor device. Electrical characteristics of the semiconductor device are greatly improved.

12 Claims, 28 Drawing Figures

METHOD FOR MANUFACTURING A SEMICONDUCTOR DEVICE

This application is a continuation of application Ser. No. 428,991, filed Sept. 30, 1983, now abandoned.

BACKGROUND OF THE INVENTION

1. Field of the Invention

The present invention relates to a method for manufacturing a semiconductor device wherein formation of a bird's beak and a bird's head when a deep oxide film is formed by local oxidation of silicon (LOCOS) is prevented.

2. Description of the Prior Art

Generally, LOCOS is known as a method for partially forming an oxide film on a semiconductor substrate. According to this method, insulating films such as an oxide film and a silicon nitride film sequentially formed on the semiconductor substrate in the order named are selectively etched to form a predetermined opening. The exposed portion of the semiconductor substrate is then chemically etched to form a groove. In this process, however, side etching occurs at the edge of the pattern. When an oxide film is formed in the groove, the oxide film grows vertically and laterally. The oxide film thus extrudes between the semiconductor substrate and the insulating film, resulting in a bird's beak. At the same time, the bird's beak acts to lift the edge of the insulating film, so that a projection called a bird's head is formed thereat. The bird's beak and head are formed since water or oxygen supplied during LOCOS permeates laterally through the oxide film.

A highly integrated and highly precise semiconductor device cannot be formed due to the bird's beak. Disconnections and short-circuiting occur due to the bird's head to cause poor step coverage when a wiring layer is deposited. Thus, the bird's beak and head do not allow preparation of a semiconductor device with high quality and at a high yield.

SUMMARY OF THE INVENTION

It is, therefore, an object of the present invention to provide a method for manufacturing a semiconductor device wherein the size of a bird's beak and head are greatly reduced compared with conventional local or selective oxidation to provide a highly integrated and highly precise semiconductor device, and wherein an excellent manufacturing process provides a flat surface of the semiconductor layer to prevent poor step coverage and to increase the yield of the semiconductor device.

According to the method of the present invention, essentially, after a predetermined opening is formed by selectively etching an insulating film formed on a semiconductor substrate and an exposed portion of the semiconductor substrate is vertically etched by anisotropic etching to form a groove, an antioxidant insulating film is formed on the side wall of the groove. Thereafter, a thick oxide film is formed in the groove, so that the antioxidant insulating film prevents lateral permeation of water or oxygen. As a result, the oxide film does not extend laterally thus reducing formation of the bird's beak and the bird's head to a minimum.

The method of the present invention can be applied to form an element isolation region in a bipolar integrated circuit and a field oxide region in a metal-oxide-semiconductor integrated circuit providing high packing density, high precision and high yield. As a result, the electrical characteristics of the semiconductor device are greatly improved.

Other objects, features and advantages of the present invention will be apparent from the following detailed description taken in conjunction with the accompanying drawings.

DETAILED DESCRIPTION OF THE PRIOR ART

Figure 1A:
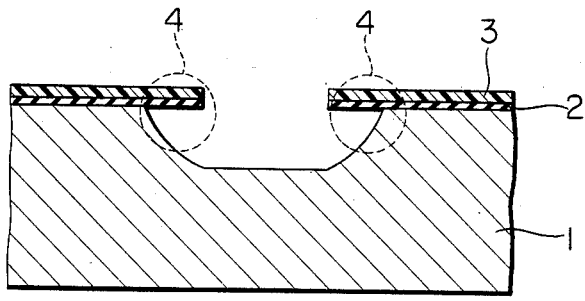
FIGS. 1A and 1B are sectional views showing a conventional local oxidation process which forms a bird's beak and a bird's head, respectively.
Figure 1B:
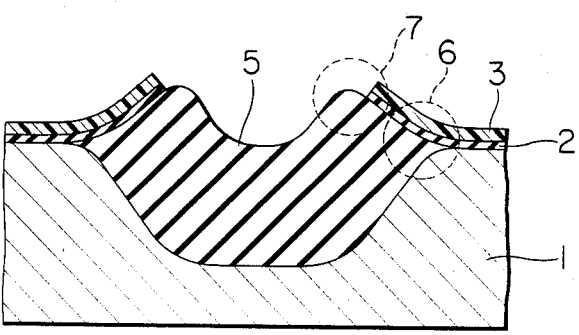

Referring to FIG. 1A, reference numeral 1 denotes an n-type semiconductor substrate; 2, an oxide film; and 3, a silicon nitride film which is not permeable to oxygen. The silicon nitride film 3 is used as a mask in local oxidation. The oxide film 2 is formed to decrease mechanical stress on the n-type semiconductor substrate during local oxidation due to a difference between thermal expansion factors of the n-type semiconductor substrate 1 and the silicon nitride film 3. Reference numeral 4 denotes side etching portions when the exposed portion of the n-type semiconductor substrate 1 is etched after the silicon nitride film 3 and the oxide film 2 are sequentially selectively etched. Side etching occurs vertically and laterally to the same degree since substantially isotropic etching is performed. FIG. 1B shows the state when local oxidation is performed after the process in FIG. 1A is completed. Reference numeral 5 denotes an oxide film formed by local oxidation; 6, a bird's beak which is a horizontally extending oxide region; and 7, a bird's head which is a projecting oxide region formed during local oxidation.

The bird's beak and head occur when water or oxygen supplied during the local oxidation step laterally permeates through the oxide film 2. Since the bird's beak 6 is formed between the silicon nitride film 3 and the n-type semiconductor substrate 1, it acts to lift the silicon nitride film 3, and hence the bird's head 7 is also formed. In particular, when the bird's beak 6 is formed, the silicon nitride film 3 is lifted, so that the permeation of water or oxygen in the lateral direction is increased. As a result, the bird's beak and head extend further. According to an experiment of the present inventors, the size of the bird's beak is about 1.6 μm and the size of the bird's head is about 1.0 μm when an oxide film is formed to a thickness of 2 μm.

The bird's beak does not allow high packing density and high precision of the semiconductor device. For example, when local oxidation is performed to form an isolation region of a bipolar transistor, the bird's beak decreases the active region, or element formation region, by 1.6 μm at each of the two ends (in total, 3.2 μm) when an element isolation region of 2 μm thickness is formed, since the transistor is surrounded by the element isolation region, thus preventing high packing density and high precision. The electrical characteristics and dimensions of the prepared transistor greatly differ from those intended at the time of design.

Furthermore, since the bird's head forms a step of 1.0 μm height between the element formation region and the surrounding region, an aluminum deposition layer may be easily disconnected. Further, short-circuiting occurs due to an unnecessary remaining portion of the aluminum deposition layer, resulting in a low yield of the semiconductor device.

DETAILED DESCRIPTION OF THE PREFERRED EMBODIMENTS

Figure 2A:
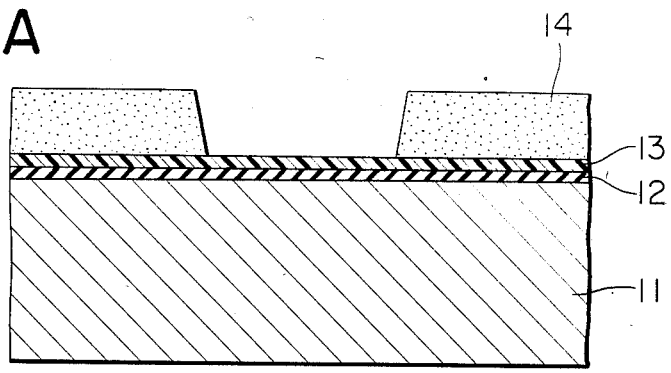
FIGS. 2A to 2E are sectional views for explaining the steps of manufacturing a semiconductor device prior to the step of local or selective oxidation according to a first embodiment of the present invention.
Figure 2B:
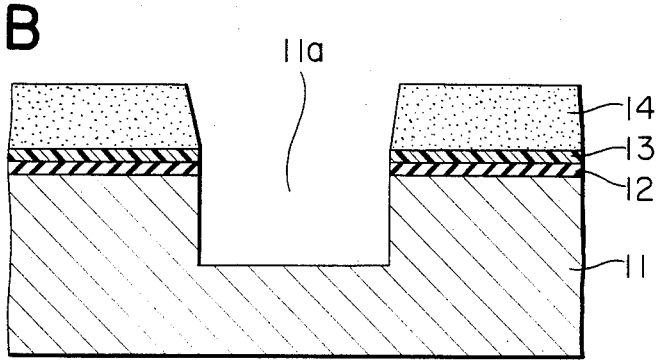

FIGS. 2A to 2E are sectional views for explaining the steps of manufacturing a semiconductor device prior to local oxidation according to a first embodiment of the present invention. Referring to FIG. 2A, reference numeral 11 denotes an n-type silicon substrate; 12, an oxide film; 13, a silicon nitride film which is not permeable to oxygen; and 14, a photoresist pattern. As shown in FIG. 2B, the silicon nitride film 13 and the oxide film 12 are sequentially selectively etched using the photoresist pattern 14 as a mask. The silicon nitride film 13 is dry etched. The oxide film 12 may be dry etched or chemically etched. Using the photoresist pattern 14 as a mask, the exposed portion of the n-type silicon substrate 11 is vertically etched by dry etching such as anisotropic reactive sputter etching or ion beam etching to form a groove 11a.

Figure 2C:
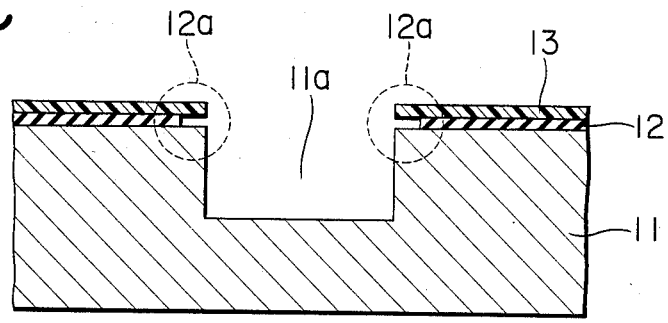

As shown in FIG. 2C, the photoresist pattern 14 is removed, and the oxide film 12 is selectively etched using the silicon nitride film 13 as a mask to form side etching portions 12a. The silicon nitride film 13 thus has overhang portions with respect to the oxide film 12. The side etched portions 12a of the oxide film 12 may be formed after the exposed portion of the n-type silicon substrate 11 is vertically etched and before the photoresist pattern 14 is removed. Alternatively, referring to FIG. 2B, the side etching portions 12a may be formed after the silicon nitride film 13 is etched and when the oxide film 12 is etched.

Figure 2D:
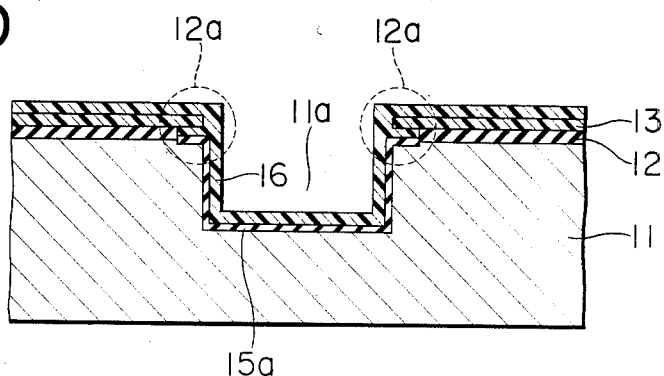

Thereafter, thermal oxidation is performed to grow an oxide film 15a to cover the entire surface of the groove 11a of the n-type silicon substrate 11 and the side etched portions 12a of the oxide film 12, that is, the entire exposed portion of the n-type silicon substrate 11, excluding the surface of the silicon nitride film 13, as shown in FIG. 2D. A silicon nitride film 16 is then formed to cover the entire surface by chemical vapor deposition (CVD). The silicon nitride film 16 is formed by the CVD method to cover the entire surface including the side etched portions 12a of the oxide film 12.

Figure 2E:
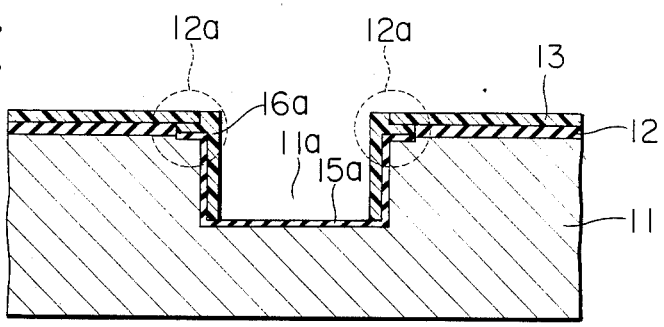

In the same manner as the n-type silicon substrate 11 was vertically etched, the silicon nitride film 16 is etched by anisotropic dry etching. In this case, the vertical groove is formed in the n-type silicon substrate, and etching progresses vertically but not laterally since anisotropic dry etching is performed. As shown in FIG. 2E, the silicon nitride film 16 formed on the silicon nitride film 13 and on the bottom of the groove of the n-type silicon substrate 11 is thus etched to leave silicon nitride films 16a on the side surfaces of the groove 11a in a self-aligned manner.

Figure 3A:
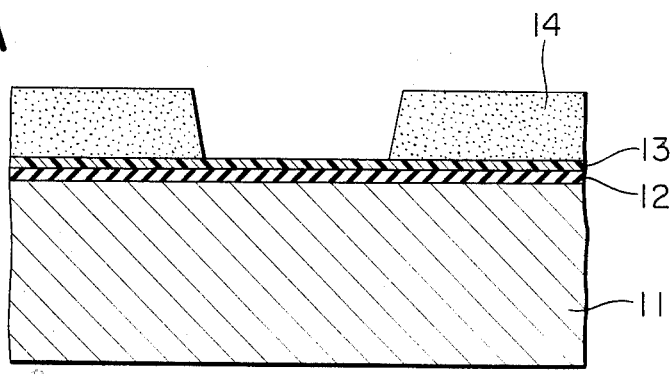
FIGS. 3A to 3E are sectional views for explaining the steps of manufacturing a semiconductor device prior to the step of local oxidation according to a second embodiment of the present invention.
Figure 3B:
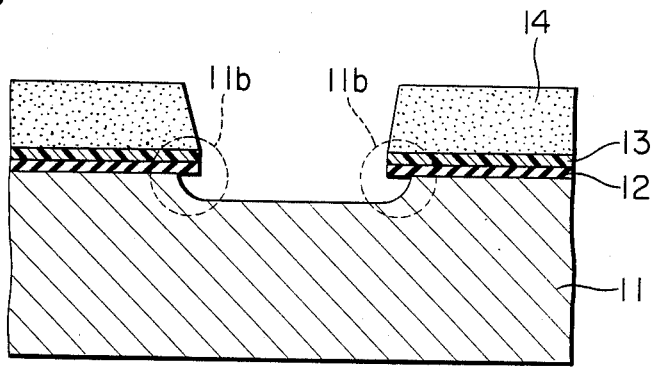
Figure 3C:
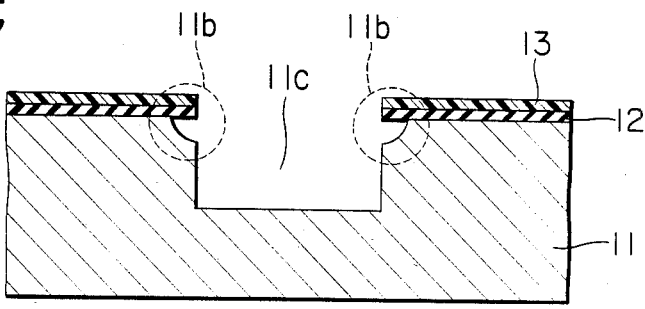

FIGS. 3A to 3E are sectional views for explaining the steps of manufacturing a semiconductor device prior to local oxidation according to a second embodiment of the present invention. The step in FIG. 3A is the same as that in FIG. 2A, and the same reference numerals as used in FIG. 2A denote the same parts in FIG. 3A. Referring to FIG. 3B, after a silicon nitride film 13 and an oxide film 12 are sequentially etched using a photoresist pattern 14 as a mask, a first step of chemical etching or isotropic dry plasma etching is performed to form a shallow groove in such a manner as to form side etching portions 11b. Thereafter, in the second step, anisotropic dry etching is performed to vertically etch the n-type silicon substrate 11 using the photoresist pattern 14 as a mask, so that a deep groove 11c which has a vertical or substantially vertical wall is formed, as shown in FIG. 3C. In this manner, since the side etching portions 11b are formed by chemical etching in the first step, the silicon nitride film 13 and the oxide film 12 have overhang portions with respect to the side etching portions 11b.

Figure 3D:
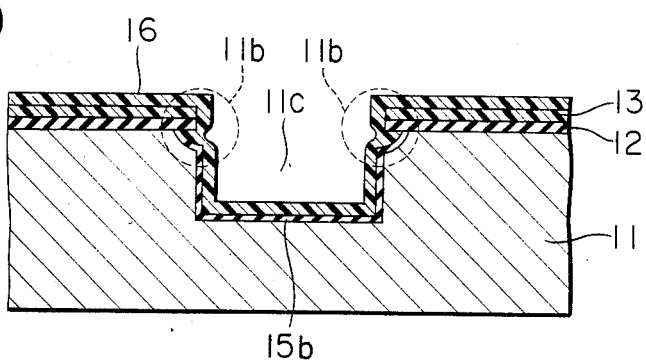
Figure 3E:
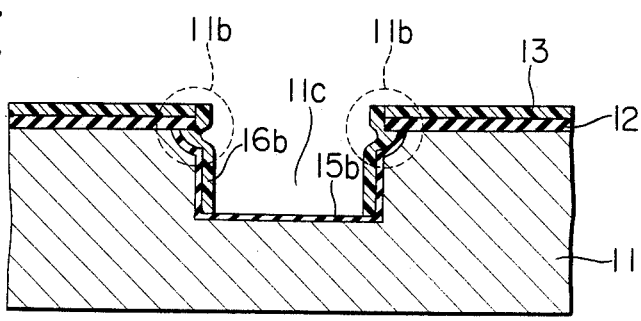

Referring to FIG. 3D, thermal oxidation is performed to form an oxide film 15b on the side etched portions 11b and on the surface of the groove 11c of the n-type silicon substrate 11. A silicon nitride film 16 is then formed by the CVD method to cover the entire surface. As shown in FIG. 3E, the portions of the silicon nitride film 16 which are formed on the bottom of the groove 11c in the n-type silicon substrate 11 and on the top surface of the silicon nitride film 13 are etched to leave silicon nitride films 16b formed on the side etching portions 11b of the n-type silicon substrate 11 and on the side walls of the groove 11c.

As shown in FIGS. 2A to 2E and FIGS. 3A to 3E in different processes, silicon nitride portions can be left, starting from the ends of the silicon nitride film 13, in the vicinity of the interface between the oxide film 12 and the n-type silicon substrate 11 and on the side walls of the groove in the n-type silicon substrate 11.

The oxide films 15a and 15b serve to decrease the mechanical stress on the n-type silicon substrate 11 in the same manner as does the oxide film 12. The formation of the silicon nitride films 16a and 16b on the side walls of the grooves 11a and 11c and in the vicinity of the interface between the n-type silicon substrate 11 and the oxide film 12 prevents lateral permeation of oxygen, and hence formation of the bird's beak. Furthermore, since water or oxygen is supplied only to the bottom surfaces of the grooves 11a and 11c which are formed in the n-type silicon substrate, side oxidation may not occur.

Figure 4:
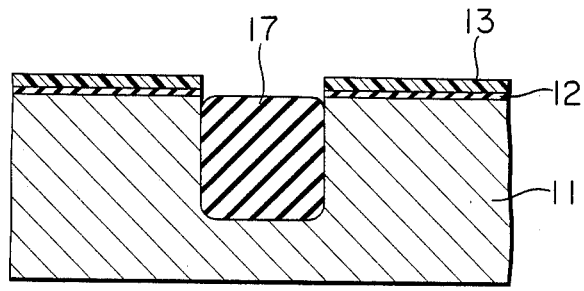
FIG. 4 is a sectional view showing the main part after local oxidation.

FIG. 4 shows a state when a wafer is locally oxidized after the steps shown in FIGS. 2A to 2E and FIGS. 3A to 3E are performed. Reference numeral 17 denotes an oxide film formed by local oxidation. The present inventors experimentally confirmed that the bird's beak and the bird's head are not substantially formed. Referring to FIG. 2E again, after the groove 11a is formed in the n-type silicon substrate 11 and the oxide film 12 is side etched, the oxide film 15a and the silicon nitride film 16a are formed, thus preventing formation of the bird's beak and the bird's head. Similarly, referring to FIG. 3E again, after the exposed portion of the n-type silicon substrate 11 is isotropically etched to form the shallow groove in the n-type silicon substrate 11 in the first step and the exposed portion thereof is again anisotropically etched in the second step to form the deep groove 11c, the oxide film 15b and the silicon nitride film 16b are formed, thus preventing formation of the bird's beak and the bird's head. The reason why the oxide film is side etched, and the reason why the n-type silicon substrate is isotropically and then anisotropically etched, is to leave a thick and stable silicon nitride film in the vicinity of the interface between the oxide film and the n-type silicon substrate when the silicon nitride film is left only on the side walls of the groove after the silicon nitride film is formed to cover the entire surface, thus preventing formation of the bird's beak.

In particular, the oxide film 12 is side etched as shown in FIG. 2E, or the n-type silicon substrate is isotropically etched in FIG. 3E to form overhang portions of the silicon nitride film 13. Further, referring to FIG. 3E, the n-type silicon substrate 11 is anisotropically etched to provide micropatterning with high precision. After the oxide film 12 is side etched or the n-type silicon substrate 11 is isotropically and then anisotropically etched, the oxide films 15a and 15b and the silicon nitride film 16 are formed. At this time, the oxide films 15a and 15b, and the silicon nitride film 16 are formed under the surfaces of the overhang portions of the silicon nitride film 13, that is, in the side etched portions 12a obtained by side etching the oxide film 12 or in the side etching portions 11b obtained by isotropically etching the n-type silicon substrate 11.

The silicon nitride film 16 is formed underneath overhang portions of the silicon nitride film 13. The oxide film 12 is completely covered by the silicon nitride films 13 and 16. Thereafter, when anisotropic dry etching is performed, the silicon nitride film portion formed on the silicon nitride film 13 and the silicon nitride film portion formed on the bottom surface of the groove in the n-type silicon substrate are completely etched. The upper end portions of the silicon nitride film which are formed on the side walls of the groove are slightly etched. However, the silicon nitride film formed underneath the overhang portions of the silicon nitride film 13 may not be etched. Therefore, the oxide film 12 is kept completely covered by the silicon nitride films 13 and 16a or 16b. Since neither oxygen nor water may permeate through the oxide film 12, the bird's beak does not substantially occur.

The present inventors compared the following cases: a first case in which the groove is formed in the n-type silicon substrate by only anisotropic dry etching; a second case in which the oxide film is side etched or the n-type silicon substrate is isotropically etched, and then anisotropic etching is performed to form the groove; and a third case in which the groove is formed by the conventional local oxidation. Assume that an oxide film is formed to a thickness of 2.0 μm in accordance with various procedures. According to the first case, the bird's beak is 1.2 μm and the bird's head is 0.5 μm. However, according to the second case to which the method of the present invention is applied, the bird's beak is less than 0.1 μm and the bird's head is not formed. According to the third case, the bird's beak is 1.6 μm and the bird's head is 1.0 μm. The size of the bird's beak is reduced to about 6% of that formed with the conventional oxidation method. Furthermore, the bird's head is not formed. According to the first case, since the silicon nitride film left in the vicinity of the oxide film is very thin, the bird's beak is formed during the process of local oxidation.

If the oxide film 17 is as thin as 1 μm, side etching of the ground oxide film 12 as shown in FIG. 2C or side etching of the n-type silicon substrate as shown in FIG. 3B need not be performed. In this case, it is found that the bird's beak is not formed even if only dry etching is performed. Therefore, if a thick oxide film is not formed, the step of forming the side etching portions may be omitted.

The bird's beak is minimized compared with the conventional method to prevent a decrease in the size of the active region or element formation region. Thus, high packing density and high precision can be provided. Furthermore, since the bird's head may not be formed, the semiconductor surface becomes flat, thus preventing short-circuiting and disconnections of the aluminum wiring layer, and increasing the stability of the manufacturing process and hence resulting in a high yield. Furthermore, since the thick oxide film is vertically formed, the electrical characteristics of the semiconductor device can be greatly improved.

A description has been made on the case wherein a oxide film is side etched and the case wherein an n-type silicon substrate is isotropically etched first and then is anisotropically etched. However, the same effect can be obtained in a case in which the oxide film is side etched and the n-type silicon substrate is isotropically and then anisotropically etched.

Application examples will be described for manufacturing bipolar transistors and a MOS transistor to which the method of the present invention is applied. Grooves in the following examples are formed by first isotropically and then anisotropically etching the semiconductor substrates.

EXAMPLE 1

Figure 5A:
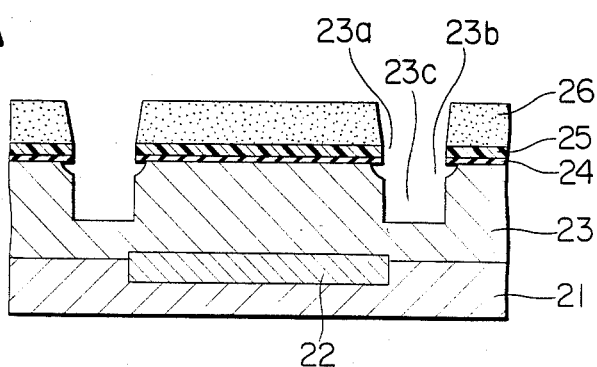
FIGS. 5A to 5E are sectional views for explaining the steps of manufacturing a bipolar transistor according to the method of the present invention.

FIGS. 5A to 5E are sectional views for explaining the steps of manufacturing a bipolar transistor to which the method of the present invention is applied. Referring to FIG. 5A, reference numeral 21 denotes a p-type silicon substrate; 22, an n+-type buried layer; 23, an n-type epitaxial layer of 1.2 μm thickness; 24, an oxide film of 1,000 Å thickness; 25, a silicon nitride film which is formed by the CVD method and has a thickness of 1,000 Å; and 26, a photoresist pattern.

The silicon nitride film 25 is dry etched using the photoresist pattern 26 as a mask. The oxide film 24 is then selectively etched to form an opening 23a. In this state, the photoresist pattern 26 remains. Thereafter, using the photoresist pattern 26 as a mask, the exposed portion of the n-type epitaxial layer is chemically etched to a depth of 0.3 μm to form a shallow groove 23b. At this time, the width (0.3 μm) of side etching is equal to the etching depth. The above etching is performed by chemical etching. However, isotropic plasma etching as one of dry etching methods may also be used to obtain the same effect. Using the photoresist pattern 26 as a mask again, anisotropic etching such as reactive sputter etching or reactive ion etching (RIE) is performed to vertically etch the exposed portion of the n-type epitaxial layer 23 to a further depth of 0.45 μm, so that a groove 23c is formed. Thus, the n-type epitaxial layer 23 is etched to a total depth of 0.75 μm.

Figure 5B:
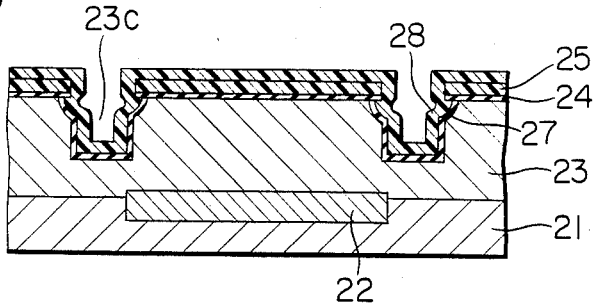

Thereafter, the photoresist pattern 26 is removed. As shown in FIG. 5B, thermal oxidation is performed to grow an oxide film 27 to a thickness of 500 Å. The oxide film 27 is formed only in the groove in the n-type epitaxial layer 23 and not on the surface of the silicon nitride film 25. The oxide film 27 may be formed by the CVD method to cover the entire surface. Thereafter, a silicon nitride film 28 is formed to cover the entire surface to a thickness of 1,000 Å.

Figure 5C:
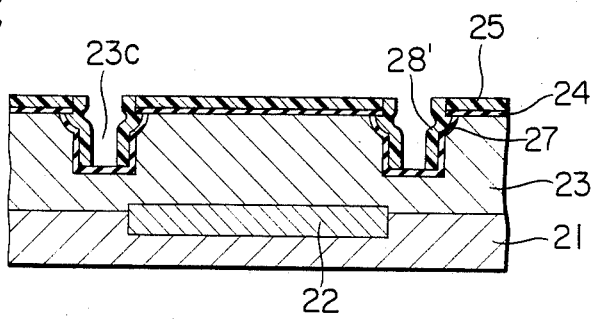

Anisotropic dry etching such as reactive sputter etching or reactive ion etching is performed. In this etching process, the silicon nitride film 28 is vertically etched, but is not laterally etched. Therefore, as shown in FIG. 5C, silicon nitride films 28' formed on the side walls of the groove 23c are left in a self-aligned manner.

Figure 5D:
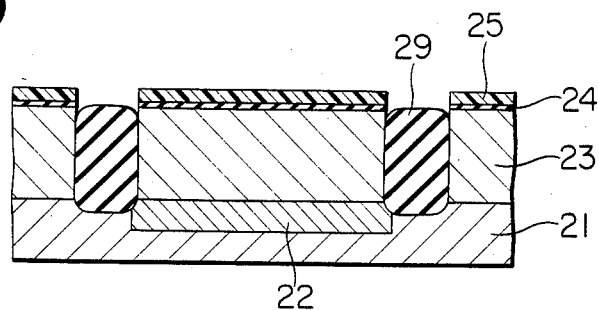

Thereafter, as shown in FIG. 5D, an oxide film 29 is formed by local oxidation for about 90 minutes to a thickness of 1.5 μm at a pressure of 6.5 kg/cm² and a temperature of 1,000° C. The n+-type buried layer 22 only slightly overlaps therewith, thus assuring excellent dielectric strength. According to the method of the present invention, the bird's beak is small and the bird's head is completely eliminated. Thus, element isolation is completely performed.

Figure 5E:
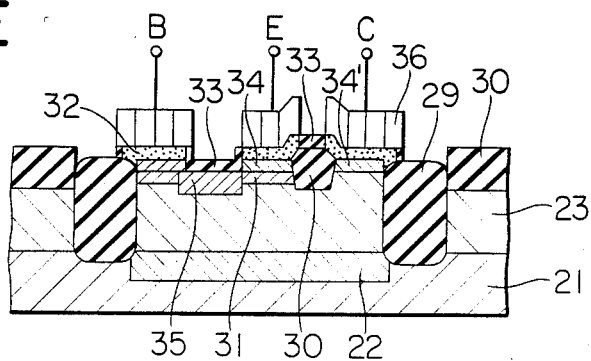

FIG. 5E shows a state where a bipolar transistor is prepared which is surrounded by the element isolation region. Reference numeral 30 also denotes an oxide film which isolates the base of the transistor from the collector thereof; 31, a p⁻-type region which constitutes an active base region; 32, doped polysilicon; 33, an oxide film which isolates the emitter from the base contact 31'; 34 and 34', n+-type regions. The n+-type region 34 functions as the emitter and the n+-type region 34' constitutes the collector contact. Reference numeral 35 denotes a p+-type region which serves to decrease a resistance of an inactive base layer and which constitutes a base contact; and 36, aluminum wiring layers.

As described above, since the silicon nitride films are formed only on the side walls of the groove in the silicon substrate in a self-aligned manner, the bird's beak and the bird's head which tend to be formed at the time of local oxidation are substantially eliminated; the bird's beak is almost eliminated; and the bird's head is completely eliminated. Since the bird's beak is minimized, the active region of the transistor may not be decreased, thus providing high packing density and high precision. Furthermore, since the bird's head is completely eliminated, the surface of the silicon substrate is kept flat, thus preventing short-circuiting and disconnections of the aluminum wiring layers. Furthermore, the manufacturing process is so stable that a high yield of the semiconductor device is assured.

The etching depth and side etching width of the silicon substrate are respectively 0.3 μm in the above description. However, the etching size is not limited to this. It is found that the size may be increased or decreased to obtain the same effect.

EXAMPLE 2

FIGS. 6A to 6D are sectional views for explaining the steps of manufacturing a bipolar IC so as to form isolation regions for the bipolar IC and for separating the base from the collector contact.

Figure 6A:
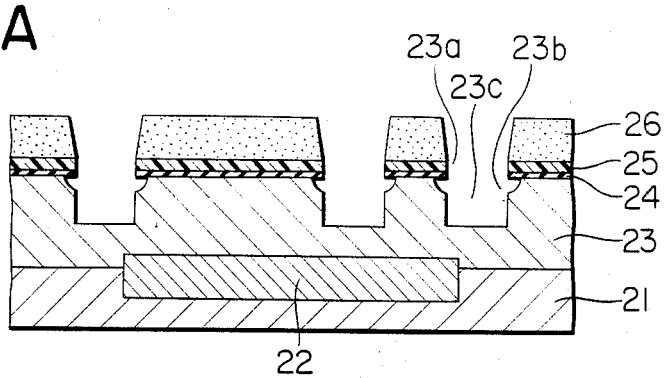
FIGS. 6A to 6D are sectional views for explaining the steps of manufacturing another bipolar transistor by forming isolation regions according to the method of the present invention.
Figure 6B:
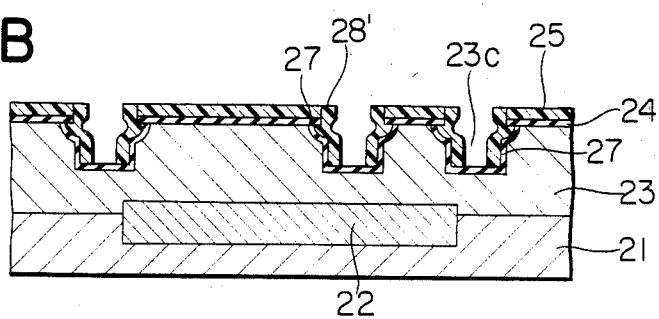
Figure 6C:
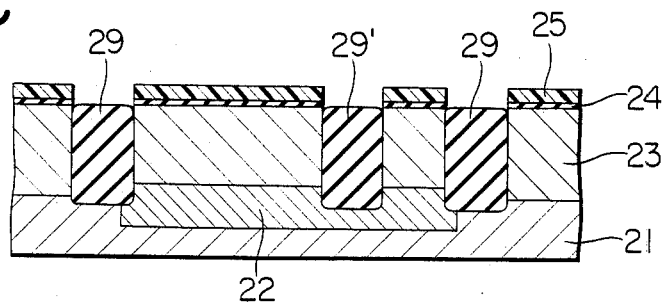
Figure 6D:
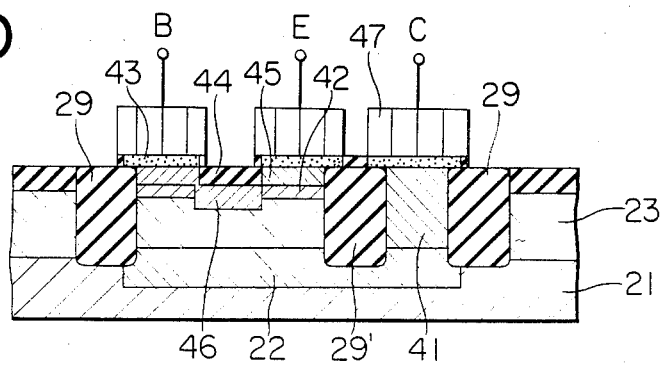

Reference numerals 21 to 29 designated with reference to FIGS. 5A to 5D denote the same parts throughout FIGS. 6A to 6D, and a detailed description thereof will be omitted. Referring to FIG. 6A, grooves 23c are formed for a prospective element isolation region and for an isolation region for isolating the base from the collector contact in the same manner as in FIG. 5A. As shown in FIG. 6B, silicon nitride films 28' are formed only on the side walls of each groove. Local oxidation is then performed to form thick oxide films 29 and 29', as shown in FIG. 6C. In this manner, an element isolation region is obtained. The thick oxide films 29 and 29' are not substantially laterally grown, so that a region surrounded by the oxide films 29 and 29', that is, a collector contact region can be made small, thus obtaining high packing density. FIG. 6D shows a case where a bipolar transistor is formed. Reference numeral 41 denotes an n+-type collector wall region which is electrically connected to an n+-type region 22 to decrease the series resistance; 42, a p⁻-type region which constitutes an active base region; 43, doped polysilicon; and 44, an oxide film for isolating the emitter from the base contact 42'. The oxide film 44 is thicker than an emitter region 45. Reference numeral 46 denotes a p+-type region which decreases the resistance of an inactive base region and which constitutes the base contact; and 47, aluminum wiring layers. The emitter region 45 is surrounded by the thick oxide films 29 and 29' and the shallow oxide film 44. According to the method of the present invention, the thick oxide films 29 and 29' may not be laterally formed, but only vertically formed. For this reason, the side surfaces of the emitter region 45 are surrounded by the oxide films 29, 29' and 44, thus decreasing a parasitic capacitance and providing high-speed operation. Furthermore, since the emitter region 45 contacts the vertical side walls of the oxide films 29 and 29', the bottom surface of the emitter region can be formed to be flat. Therefore, a uniform base width is provided over the entire area immediately under the emitter region. Thus, the high frequency characteristics of the bipolar transistor are greatly improved. Furthermore, the current amplification factor $h_{FE}$ is also improved.

Since the emitter region contacts the oxide films according to the method of the present invention, the electrical characteristics of the bipolar transistor are greatly improved.

Furthermore, since the p⁻-type base region 42 is surrounded by the oxide films which have vertical walls, the p⁻-type base region 42 is completely isolated from the base region of another transistor by means of the oxide films. Therefore, a parasitic pnp transistor may not be formed, thus preventing the latch-up phenomenon. A highly reliable IC can be readily designed and formed without providing a practical countermeasure for the latch-up phenomenon.

EXAMPLE 3

FIGS. 7A to 7F are sectional views for explaining the steps of manufacturing a MOS transistor wherein the method of the present invention is applied to the formation of a field oxide film.

Figure 7A:
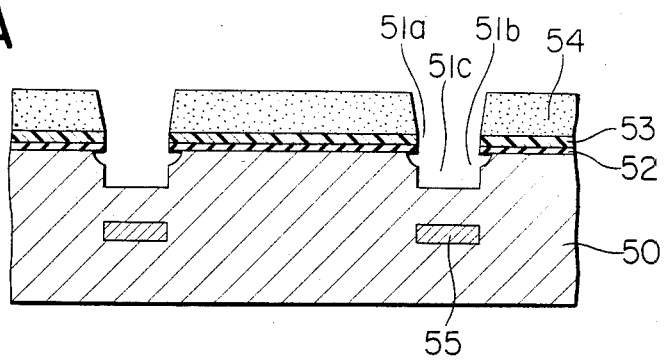
FIGS. 7A to 7F are sectional views for explaining the steps of manufacturing a MOS transistor by forming a field oxide film according to the method of the present invention.
Figure 7B:
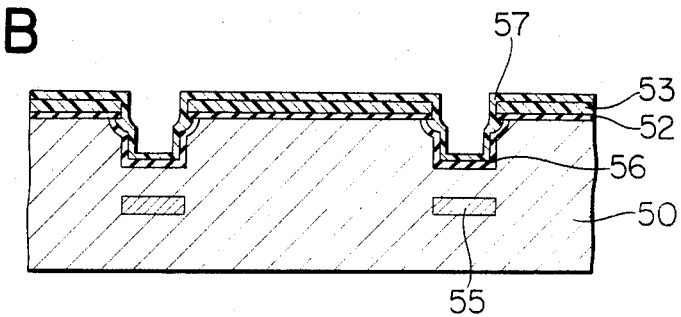
Figure 7C:
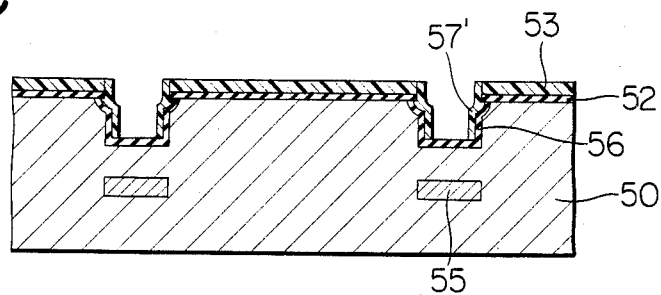
Figure 7D:
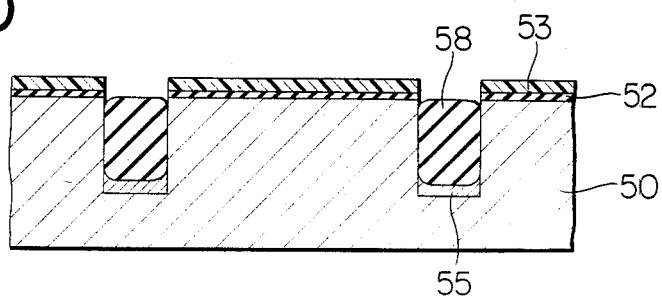

Referring to FIG. 7A, reference numeral 50 denotes a p-type semiconductor substrate; 52, a oxide film; 53, a silicon nitride film; 54, a photoresist pattern formed by photolithography; 51a, an opening formed in the silicon nitride film 53 and the oxide film 52; 51b, a shallow groove formed in the p-type semiconductor substrate 50; and 51c, a deep groove which has vertical walls. Using the photoresist pattern 54 as a mask, boron is ion-implanted in the groove 51c in the p-type semiconductor substrate to form a p+-type channel stopper 55. Thereafter, as shown in FIG. 7B, the photoresist pattern 54 is removed. An oxide film 56 is formed to cover the exposed portions of the p-type semiconductor substrate, and a silicon nitride film 57 is formed to cover the entire surface. As shown in FIG. 7C, anisotropic dry etching is performed to selectively etch the silicon nitride film 57 and to leave silicon nitride films 57' on the side walls of the groove 51c of the p-type semiconductor substrate 50. Subsequently, local oxidation is performed to form a thick field oxide film 58 which reaches to the p+-type channel stopper 55, as shown in FIG. 7D. The method of the present invention substantially eliminates the bird's beak and the bird's head, so that the channel stopper can be formed in a position two or three times deeper than that formed in the conventional MOS transistor without impairing the high packing density. The p+-type channel stopper 55 can be greatly spaced apart from the surface of the p-type semiconductor substrate 50.

Figure 7E:
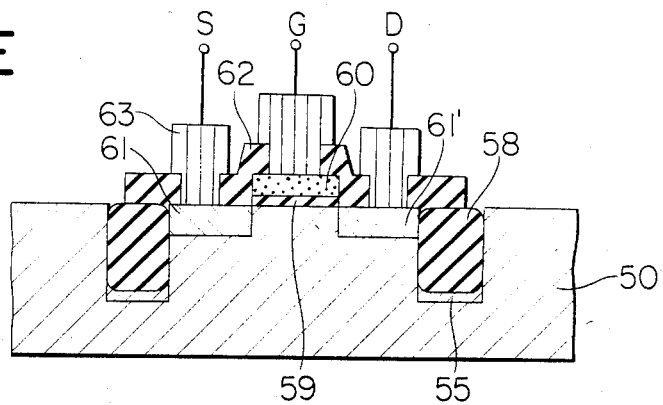
Figure 7F:
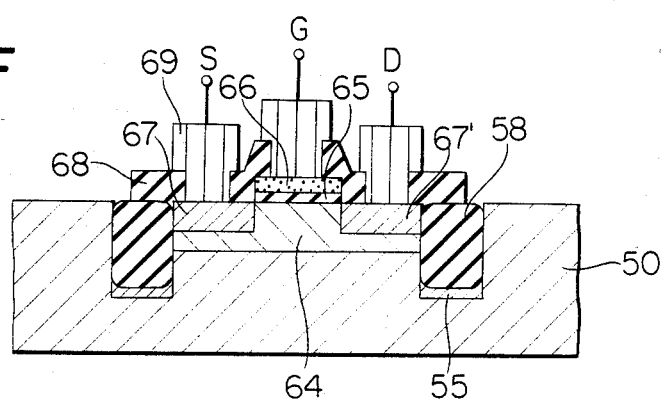

FIG. 7E is a sectional view of an n-channel MOS transistor after the field oxide film 58 is formed. Reference numeral 59 denotes a gate oxide film; 60, a polysilicon gate; and 61 and 61', n+-type regions. The n+-type region 61 forms a source region, and the n+-type region 61' forms a drain region. Reference numeral 62 denotes a CVD-SiO$_2$ film for forming a contact hole; and 63, aluminum wiring layers. FIG. 7F is a sectional view of a CMOS transistor after the field oxide film 58 is formed. Reference numeral 64 denotes an n⁻-type well region; 65, a gate oxide film; 66, a doped polysilicon gate; and 67 and 67', p+-type regions. The p+-type region 67 constitutes a source region, and the p+-type region 67' constitutes a drain region. Reference numeral 68 denotes a CVD-SiO$_2$ film; and 69, aluminum wiring layers.

As described above in Example 3, according to the method of the present invention, the field oxide film may not be laterally formed, but only vertically formed. Therefore, the high packing density can be accomplished, and the channel stopper can be formed two or three times deeper than the conventional channel stopper. Along with the micropatterning of the MOS transistor, the narrow channel effect occurs. The threshold voltage Vth is increased when the gate width is decreased. An impurity in the p+-type impurity region formed as the channel stopper is laterally diffused by annealing. Thus, the impurity is diffused in the channel region and, especially, the impurity concentration is increased in the interface between the channel region and the field oxide film. When the channel width is large, even if the impurity concentration is increased in the interface between the channel region and the field oxide film the impurity may not adversely affect the central portion of the channel region. However, when the channel width is decreased, a high impurity concentration throughout the channel region as well as at the end portions thereof results in the narrow channel effect due to lateral diffusion of the p+-type diffusion region as the channel stopper.

In the MOS transistor prepared by the method of the present invention, the channel stopper can be formed as deep as possible. Therefore, even if the impurity is laterally diffused by annealing, the impurity may not affect the channel region. The narrow channel effect may not occur even if micropatterning is developed, thus obtaining the stable threshold voltage Vth, and hence a highly integrated and highly reliable MOS transistor with improved electrical characteristics.

Furthermore, since the low-impurity doped well region of the CMOSFET is surrounded by the oxide film which has vertical walls, the well region is completely isolated by the oxide film. Therefore, an npn or pnp parasitic transistor may not be formed, thus preventing the latch-up phenomenon and providing a highly reliable IC without providing a special countermeasure for the latch-up phenomenon.

As described above, according to the method of the present invention, the silicon nitride films can be stably left only on the side walls of the groove formed in the silicon substrate so as to substantially eliminate the bird's beak and the bird's head, unlike with conventional local oxidation. In particular, since the bird's beak is minimized, the active region of the transistor or the element formation region may not be narrowed, thus contributing to the high packing density and high precision. Since the bird's head is completely eliminated, the surface of the silicon substrate is made flat, thus preventing short-circuiting and disconnections of the aluminum wiring layers. Furthermore, since the manufacturing step is very stable, a high yield of the semiconductor device is assured. When the present invention is applied to the manufacture of the bipolar transistor, the thick oxide film which has vertical walls may be formed. When the emitter region is formed to be in contact with the oxide film, the side surfaces of the emitter region are completely surrounded by the oxide film, thus decreasing the parasitic capacitance and providing high-speed operation. Furthermore, since the bottom surface of the emitter region can be made flat, a uniform base width is assured immediately under the emitter region, the high frequency characteristics are improved, and hence the current amplification factor h$_{FE}$ is improved.

When the method of the present invention is applied to the manufacture of the MOS transistor, the channel stopper can be formed as deep as possible without impairing the high packing density since the bird's beak does not occur. Therefore, even if the impurity in the p-type diffusion region is laterally diffused by annealing, the impurity may not affect the channel region. For this reason, even if the channel width is decreased, the narrow channel effect may not occur, thus obtaining stable electrical characteristics.

Furthermore, in the bipolar IC and the CMOSIC, a low-impurity doped layer (corresponding to the active base region in the bipolar IC and the well region in the CMOSIC) is surrounded by the oxide film which has vertical walls, so that the oxide film completely isolates the bipolar IC or the CMOSIC from the adjacent bipolar IC or the CMOSIC. Thus, a parasitic transistor may not be formed and the latch-up phenomenon is completely prevented. Thus, a highly reliable semiconductor device can be readily designed and manufactured.

As described above, the method of the present invention contributes to high packing density, high precision, and a high yield. Furthermore, the method of the present invention provides good electrical characteristics and may be used in a variety of industrial applications.

What is claimed is:

1. A method of manufacturing an intermediate product for use in manufacturing a semiconductor device, comprising the steps of:
    (a) sequentially forming a first insulating film and a first antioxidant insulating film on a semiconductor region of one conductivity type;
    (b) selectively etching said first antioxidant insulating film and said first insulating film to form an opening;
    (c) substantially vertically etching said semiconductor region by an anisotropic dry etching method in the pattern of said opening formed in first antioxidant insulating film to form a groove having sidewalls and a bottom;
(d) side etching said first insulating film using said first antioxidant insulating film as a mask to form side etched portions;
(e) forming second antioxidant insulating film portions on the side walls of said groove including said side etched portions of said semiconductor region and excluding the bottom of said groove; and
(f) oxidizing a portion of said semiconductor region defining said groove so as to form a third insulating film.

2. A method according to claim 1, wherein said first antioxidant insulating film and said second antioxidant insulating film portions comprise silicon nitride films.

3. A method according to claim 1, wherein said step (e) comprises forming a second antioxidant insulating film to cover the entire surface, and thereafter partially removing said second antioxidant insulating film by an anisotropic dry etching method to leave said second antioxidant insulating film portions on said sidewalls.

4. A method according to claim 1, wherein a second insulating film is formed before said second antioxidant insulating film portions is formed on the sidewalls of said groove.

5. A method of manufacturing an intermediate product for use in manufacturing a semiconductor device, comprising the steps of:
(a) sequentially forming a first insulating film and a first antioxidant insulating film on a semiconductor region of one conductivity type;
(b) selectively etching said first antioxidant insulating film and said first insulating film to form an opening;
(c) isotropically etching said semiconductor region using said first antioxidant insulating film and said first insulating film as a mask to form side etched portions;
(d) substantially vertically etching said semiconductor region by an anisotropic dry etching method in the pattern of said opening formed in said first antioxidant insulating film to form a groove having a sidewall and a bottom;
(e) forming second antioxidant insulating film portions on the side walls of said groove including said side etched portions of said semiconduct or region and excluding the bottom thereof; and
(f) oxidizing a portion of said semiconductor region defining said groove so as to form a third insulating film.

6. A method according to claim 5, wherein said first antioxidant insulating film and said second antioxidant insulating film portions comprise silicon nitride films.

7. A method according to claim 5, wherein said step (e) comprises forming a second antioxidant insulating film on the entire surface, and thereafter partially removing said second antioxidant insulating film to leave said second antioxidant insulating film portions on the side surfaces of said groove including said side etched portions.

8. A method according to claim 5, wherein a second insulating film is formed on said sidewalls before said second antioxidant insulating film portions are formed on the sidewalls of said groove.

9. A method of manufacturing an intermediate product for use in manufacturing a semiconductor device, comprising the steps of:
(a) sequentially forming a first insulating film and a first antioxidant insulating film on a semiconductor region of one conductivity type;
(b) selectively etching said first antioxidant insulating film and said first insulating film to form an opening;
(c) isotropically etching said semiconductor region using said first antioxidant insulating film and said first insulating film as a mask to form side etched portions;
(d) substantially vertically etching said semiconductor region by an anisotropic dry etching method in the pattern of said opening of said first antioxidant insulating film to form a groove having sidewalls and a bottom;
(e) doping an impurity in a portion of said semiconductor region below said groove to form a high concentration P-type semiconductor region;
(f) forming second antioxidant insulating film portions on sidewalls of said groove including said side etched portions of said semiconductor region and excluding the bottom of said groove; and
(g) oxidizing a portion of said semiconductor region defining said groove to form a third insulating film.

10. A method according to claim 9, wherein said high-concentration semiconductor region comprises a channel stopper.

11. A method according to claim 9, wherein an impurity is doped in an island region surrounded by said third insulating film so as to form a low-concentration semiconductor region having a different conductivity type than that of said semiconductor region.

12. A method of manufacturing an intermediate product for use in manufacturing a semiconductor device, comprising the steps of:
(a) sequentially forming a first insulating film and a first antioxidant insulating film on a semiconductor region initially of one conductivity type;
(b) selectively etching said first antioxidant insulating film and said first insulating film to form a generally annular opening;
(c) isotropically etching said semiconductor region using said first antioxidant insulating film and said first insulating film as a mask to form side etched portions;
(d) substantially vertically etching said semiconductor region by an anisotropic dry etching method in the pattern of said generally annular opening of said first antioxidant insulating film to form a generally annular groove having sidewalls and a bottom;
(e) forming second antioxidant insulating film portions on the sidewalls of said groove including said side etched portions of said semiconductor region and excluding the bottom of said groove;
(f) oxidizing portions of said semiconductors region defining said groove to form a third insulating film; and
(g) forming a base and an emitter in an island region of said semiconductor region surrounded by said third insulating film, such that sidewalls of said base are entirely in contact with said third insulating film and those of said emitter are partially in contact with said third insulating film.

* * * * *